US012620833B2

(12) United States Patent
Mitsuya et al.

(10) Patent No.: US 12,620,833 B2
(45) Date of Patent: May 5, 2026

(54) MONITORING DEVICE

(71) Applicant: SAGINOMIYA SEISAKUSHO, INC., Tokyo (JP)

(72) Inventors: Hiroyuki Mitsuya, Sayama (JP); Hisayuki Ashizawa, Sayama (JP); Takuro Ishikawa, Sayama (JP)

(73) Assignee: SAGINOMIYA SEISAKUSHO, INC., Tokyo (JP)

( * ) Notice: Subject to any disclaimer, the term of this patent is extended or adjusted under 35 U.S.C. 154(b) by 45 days.

(21) Appl. No.: 18/282,686

(22) PCT Filed: Mar. 24, 2022

(86) PCT No.: PCT/JP2022/014182
§ 371 (c)(1),
(2) Date: Sep. 18, 2023

(87) PCT Pub. No.: WO2022/224698
PCT Pub. Date: Oct. 27, 2022

(65) Prior Publication Data
US 2024/0162747 A1 May 16, 2024

(30) Foreign Application Priority Data

| | | |
|---|---|---|
| Apr. 22, 2021 | (JP) | 2021-072721 |
| Jul. 14, 2021 | (JP) | 2021-116338 |
| Mar. 17, 2022 | (JP) | 2022-043152 |

(51) Int. Cl.
*H02J 50/00* (2016.01)
*G01H 11/06* (2006.01)
(Continued)

(52) U.S. Cl.
CPC ............ *H02J 50/001* (2020.01); *G01H 11/06* (2013.01); *G01R 31/62* (2020.01); *G01R 19/16576* (2013.01)

(58) Field of Classification Search
CPC ....... H02J 50/001; G01H 11/06; G01R 31/62; G01R 19/16576; Y02E 10/72
See application file for complete search history.

(56) References Cited

U.S. PATENT DOCUMENTS

| | | | |
|---|---|---|---|
| 2005/0017602 A1 | 1/2005 | Arms et al. | |
| 2013/0049733 A1* | 2/2013 | Neti | F03D 7/0264 |
| | | | 324/71.1 |

(Continued)

FOREIGN PATENT DOCUMENTS

| | | |
|---|---|---|
| CN | 101630433 A | 1/2010 |
| CN | 105765854 A | 7/2016 |

(Continued)

OTHER PUBLICATIONS

English translation of JP-2018141751-A (Year: 2018).*

(Continued)

*Primary Examiner* — Huy Q Phan
*Assistant Examiner* — Haidong Zhang
(74) *Attorney, Agent, or Firm* — The Webb Law Firm

(57) ABSTRACT

A monitoring device includes a vibration-driven energy harvesting element as a vibration-driven energy harvesting unit that performs power generation in response to a sound or a vibration being occurred by a monitoring target and having a predetermined frequency, and a notification unit that notifies a state change of the monitoring target based on a magnitude relationship between a predetermined threshold value and a voltage value of the power generation by the vibration-driven energy harvesting element. The notification unit is configured to notify the state change when the vibration-driven energy harvesting element performs the power generation. Therefore, the vibration-driven energy harvesting element, which functions as a sensor unit, requires no power supply.

12 Claims, 6 Drawing Sheets

(51) Int. Cl.
    *G01R 19/165*      (2006.01)
    *G01R 31/62*      (2020.01)

(56)            References Cited

U.S. PATENT DOCUMENTS

| | | |
|---|---|---|
| 2016/0043663 A1 | 2/2016 | Katsumura et al. |
| 2018/0251097 A1 | 9/2018 | Masaki |
| 2019/0136861 A1 | 5/2019 | Rosca et al. |

FOREIGN PATENT DOCUMENTS

| | | | |
|---|---|---|---|
| CN | 106329987 A | | 1/2017 |
| CN | 107000691 A | | 8/2017 |
| JP | H0416724 A | | 1/1992 |
| JP | 2006234784 A | | 9/2006 |
| JP | 2009258063 A | | 11/2009 |
| JP | 2014062775 A | | 4/2014 |
| JP | 2018141751 A | * | 9/2018 |
| JP | 6829119 B2 | | 2/2021 |
| JP | 2021018148 A | | 2/2021 |

OTHER PUBLICATIONS

EP 22791474, Extended European Search Report, Dec. 13, 2024.
International Report on Patentability, PCT/JP2022/014182, Nov. 2, 2023.

\* cited by examiner

MONITORING DEVICE

CROSS-REFERENCE TO RELATED APPLICATIONS

This application is the United States national phase of International Application No. PCT/JP2022/014182 filed Mar. 24, 2022, and claims priority to Japanese Patent Application No. 2021-072721 filed Apr. 22, 2021, Japanese Patent Application No. 2021-116338 and Japanese Patent Application No. 2022-043152 filed Mar. 17, 2022, filed Jul. 14, 2021, the disclosures of which are hereby incorporated by reference in their entireties.

BACKGROUND OF THE INVENTION

Field of the Invention

The present invention relates to a monitoring device.

Description of Related Art

Conventionally, there have been known anomaly diagnosis apparatuses for a machine and equipment that identify the presence or absence or a sign of an anomaly in a rotary component such as a railroad vehicle and a wind turbine for power generation or identify the location of the anomaly (see Japanese Patent Laid-Open No. 2006-234784). In an anomaly diagnosis apparatus described in Japanese Patent Laid-Open No. 2006-234784, a sensor detects a vibration of a rolling bearing, and a signal processing unit takes in an electric signal from the sensor and analyzes a state of the vibration. The signal processing unit performs a frequency analysis of a waveform of the electric signal, a comparison between a frequency component in measured spectrum data obtained by the frequency analysis and a frequency component attributable to the component, and determination of the presence or absence of an anomaly in the component and the location of the anomaly based on a result of the comparison, and the like.

SUMMARY OF THE INVENTION

Technical Problem

In the anomaly diagnosis apparatus described above, a vibration sensor, an acoustic emission (AE) sensor, an ultrasonic sensor, or the like is used as the sensor that is used to detect the vibration. The sensor requires supply of electric power thereto, and a high electric power is consumed by the signal processing unit that performs signal processing and the determination of the presence or absence and the location of an anomaly and the like. This raises a problem in that the anomaly diagnosis apparatus is not practical for continuously monitoring the determination of the presence or absence of an anomaly in a component because a frequency of battery replacement increases.

Solution to Problem

A monitoring device according to an aspect of the present invention includes a vibration-driven energy harvesting unit that performs power generation in response to a sound or a vibration being occurred by a monitoring target and having a predetermined frequency, and a notification unit that notifies a state change of the monitoring target based on a magnitude relationship between a predetermined threshold value and a voltage value of the power generation by the vibration-driven energy harvesting unit.

Advantageous Effect of Invention

According to the present invention, the vibration-driven energy harvesting unit functions as a sensor unit that catches a sound or a vibration. Therefore, no power supply is needed for the sensor unit, allowing power saving for the monitoring device.

BRIEF DESCRIPTION OF THE DRAWINGS

The terms FIG., FIGS., FIGURE, and Figures are used interchangeably in the specification to refer to the corresponding figures in the drawings.

DESCRIPTION OF THE INVENTION

Figure 1:
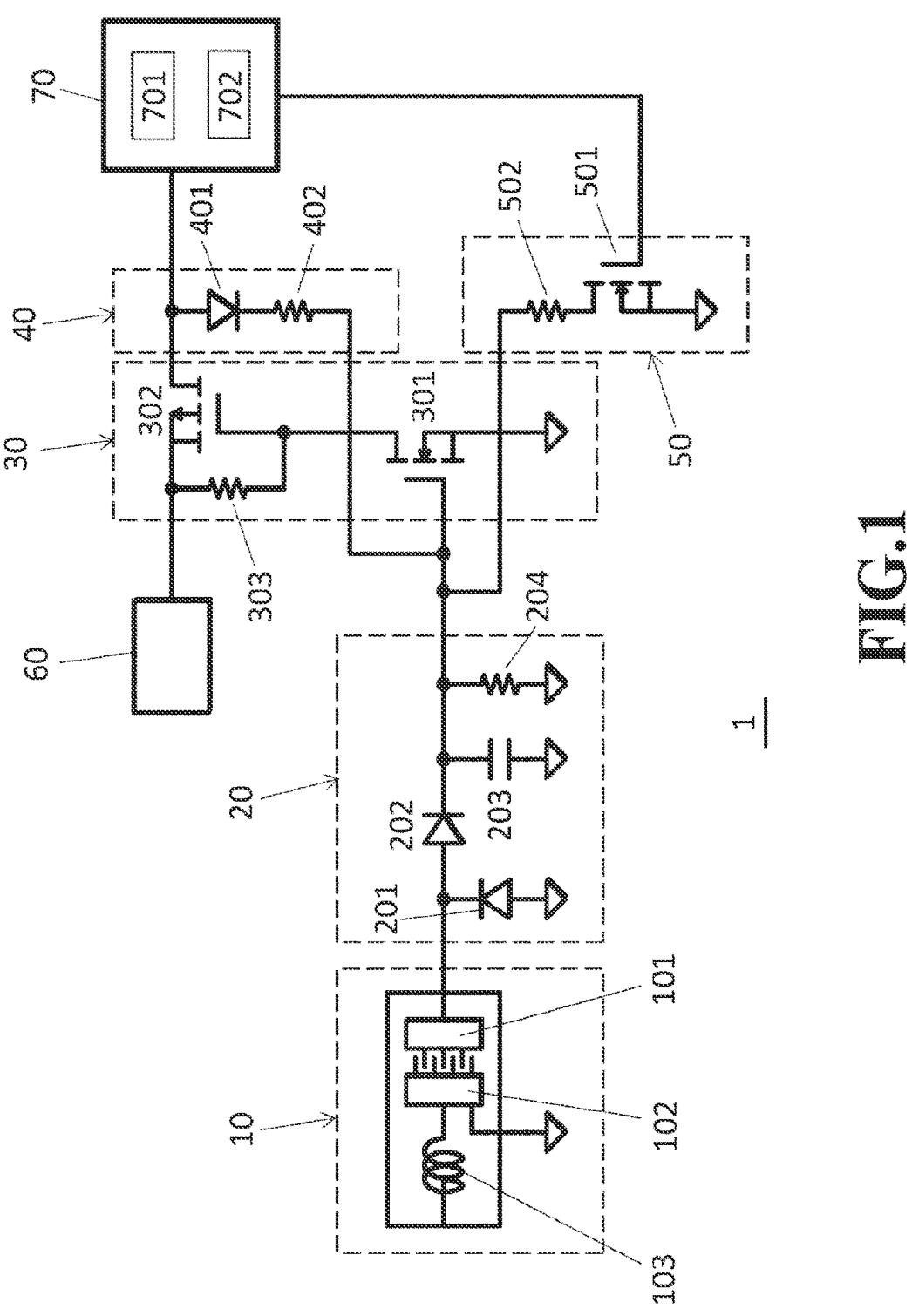
FIG. 1 is a block diagram illustrating a schematic configuration of a monitoring device.

An embodiment for implementing the present invention will be described below with reference to the drawings. FIG. 1 is a block diagram illustrating a schematic configuration of a monitoring device 1 in the present embodiment. The monitoring device 1 includes a vibration-driven energy harvesting element 10, a rectification/electricity storage unit 20, a switch circuit 30, a self-holding circuit 40, a turn-off circuit 50, a battery 60, and a notification unit 70 that operates on the battery 60 as a power supply.

The vibration-driven energy harvesting element 10 includes a fixed comb electrode 101 and a movable comb electrode 102 that is supported by an elastic support part 103. The movable comb electrode 102 is caused to vibrate with respect to the fixed comb electrode 101 by a sound or a vibration that is a monitoring target, thus generating electric power. A natural frequency of the vibration-driven energy harvesting element 10 is set to a frequency of the sound or the vibration being the monitoring target. The vibration-driven energy harvesting element 10 is thus configured such that the movable comb electrode resonates with the sound or the vibration being the monitoring target, generating higher electric power. The vibration-driven energy harvesting element 10 is an electret energy harvesting element. However, a piezo energy harvesting element, an electromagnetic-induction energy harvesting element, or a magnetostriction energy harvesting element may be used, for example. In all cases, the natural frequency of the vibration-driven energy harvesting element 10 is set to the frequency of the sound or the vibration being the monitoring target.

The rectification/electricity storage unit 20 converts an AC voltage output from the vibration-driven energy harvesting element 10 into a DC voltage with the diodes 201 and 202 and charges a capacitor 203. To the capacitor 203, a resistor 204 is connected in parallel. When the power generation by the vibration-driven energy harvesting element 10 stops, the resistor 204 acts in such a manner as to lower a charge voltage V1 of the capacitor 203. A resistance value of the resistor 204 and a capacitance of the capacitor 203 are adjusted as appropriate in accordance with a duration of the vibration, an amount of the power generation, and the like, as will be described later.

The switch circuit 30 is provided with two switching elements 301 and 302. The switch circuit 30 is a circuit that turns on/off supply of electric power from the battery 60 to the notification unit 70. In the example illustrated in FIG. 1, an N-channel MOSFET 301 and a P-channel MOSFET 302 are used as the two switching elements. However, the two switching elements are not limited to this example. Transistors or the like may be used as the two switching elements.

The N-channel MOSFET 301 has a gate to which the charge voltage V1 of the capacitor 203 is applied. The N-channel MOSFET 301 has a drain connected to a gate of the P-channel MOSFET 302. The P-channel MOSFET 302 has a source connected to the battery 60 and has a drain connected to the notification unit 70. Between the source and the gate of the P-channel MOSFET 302, a resistor 303 is provided. The drain of the N-channel MOSFET 301 is also connected to the battery 60 via the resistor 303.

When the power generation of the vibration-driven energy harvesting element 10 brings the charge voltage V1 of the capacitor 203, that is, a gate-source voltage Vgs1 of the N-channel MOSFET 301 to greater than or equal to a gate threshold voltage Vth1, the N-channel MOSFET 301 enters an on state, causing current to flow from the drain to the source. When the N-channel MOSFET 301 enters the on state, causing the current to flow through the resistor 303, a gate potential of the P-channel MOSFET 302 becomes lower than a source potential of the P-channel MOSFET 302 by a voltage drop caused by the current flow through the resistor 303. A value of the resistor 303 is set such that the voltage drop is higher than a gate threshold value Vth2 of the P-channel MOSFET 302. When the current flows through the resistor 303, the P-channel MOSFET 302 enters an on state, causing current to flow from the source to the drain. As a result, the supply of electric power from the battery 60 to the notification unit 70 is started.

When the amount of the power generation by the vibration-driven energy harvesting element 10 decreases, charged electric charge of the capacitor 203 is discharged via the resistor 204, and thus the charge voltage V1 of the capacitor 203, that is, the gate-source voltage Vgs1 of the N-channel MOSFET 301 is lowered. Then, when the gate-source voltage Vgs1 becomes lower than the gate threshold voltage Vth1, the N-channel MOSFET 301 enters an off state, causing the current not to flow between the source and the drain. As a result, the voltage drop by the resistor 303 disappears, which brings the P-channel MOSFET 302 into an off state, and the supply of electric power from the battery 60 to the notification unit 70 is stopped.

The notification unit 70 is provided with a transmission unit 701 that wirelessly transmits an anomaly signal and provided with a control unit 702. The notification unit 70 is activated by the supply of electric power and transmits an anomaly signal from the transmission unit 701. When the transmitted anomaly signal is received, a user can determine that an anomaly has occurred in the monitoring target. In contrast, when no anomaly signal is received, the user determines that the monitoring target is normal.

As described above, when the amount of the power generation by the vibration-driven energy harvesting element 10 decreases, the charge voltage V1 becomes lower than the gate threshold voltage Vth1, and the N-channel MOSFET 301 enters the off state. However, it is undesirable that the N-channel MOSFET 301 is turned off to stop the supply of electric power to the notification unit 70 before a process of transmitting an anomaly signal in the transmission unit 701 is completed. In contrast, after the process of transmitting an anomaly signal has been completed, consumption of the battery 60 needs to be minimized. In the present embodiment, the self-holding circuit 40 is provided to maintain the on state of the N-channel MOSFET 301 even when the amount of the power generation by the vibration-driven energy harvesting element 10 decreases, and the turn-off circuit 50 is provided to turn off the switch circuit 30 after the process of transmitting an anomaly signal has been completed.

The self-holding circuit 40 is a circuit in which a resistor 402 is connected in series to a cathode of a diode 401. The self-holding circuit 40 is connected between a power supply line between the P-channel MOSFET 302 and the notification unit 70 and a charge voltage output line of the rectification/electricity storage unit 20 connected to the gate of the N-channel MOSFET 301. When the P-channel MOSFET 302 enters the on state, connecting the power supply line connected to the self-holding circuit 40 to the battery 60, current flows through the diode 401, the resistor 402, and the resistor 204. As a result, a voltage (a potential with respect to the ground) of the charge voltage output line of the rectification/electricity storage unit 20 is fixed to substantially the same value as a value of the power supply voltage divided by the resistors 402 and 204. Values of the resistors 402 and 204 are set such that a value of the voltage drop by the resistor 204 is higher than the gate threshold voltage of the N-channel MOSFET 301. As a result, the N-channel MOSFET 301 is maintained in the on state while the electric power is supplied to the notification unit 70. That is, the self-holding circuit 40 can extend an on-state time period of the N-channel MOSFET 301 as long as necessary even when a duration of an abnormal vibration is shorter than a time period during which the on state needs to be maintained, thus enabling the notification unit 70 to perform a notification action reliably.

In contrast, while the self-holding circuit 40 maintains the N-channel MOSFET 301 in the on state, electric power in the battery 60 is consumed by at least the switch circuit 30 and the self-holding circuit 40. For this reason, the turn-off circuit 50 is caused to operate to turn off the N-channel MOSFET 301 so as to prevent the electric power from being consumed uselessly after the process of transmitting an anomaly signal has been completed. The turn-off circuit 50 is a circuit in which a resistor 502 is connected in series to a drain of an N-channel MOSFET 501. The other end of the resistor 502 is connected to the charge voltage output line of the rectification/electricity storage unit 20. The notification unit 70 stops application of voltage to a gate of the N-channel MOSFET 501 with a control command from the control unit 702.

When the process of transmitting an anomaly signal is completed, the notification unit 70 applies a voltage higher than a gate threshold voltage Vth3 to the gate of the N-channel MOSFET 501 with a gate voltage application command from the control unit 702. This application brings the N-channel MOSFET 501 into an on state, causing current to flow in the order of the power supply line the diode 401 the resistor 402 the resistor 502 the N-channel MOSFET 501 the ground. As a result, a voltage (a potential with respect to the ground) of the charge voltage output line of the rectification/electricity storage unit 20 is fixed to substantially the same value as a value of the power supply voltage divided by the resistors 402 and 502.

Resistance values of the resistors 402 and 502 are set in such a manner that a voltage drop by the resistor 502 is sufficiently lower than the gate threshold voltage Vth1 of the N-channel MOSFET 301. As a result, the capacitor 203 is discharged via the resistor 502 and the N-channel MOSFET 501, and the charge voltage V1 of the capacitor 203 becomes sufficiently lower than the gate threshold voltage Vth1, bringing the N-channel MOSFET 301 into the off state. The P-channel MOSFET 302 is also thereby turned off, stopping the supply of electric power from the battery 60 to the notification unit 70.

In the present embodiment, the capacitor 203 and a gate capacitance of the N-channel MOSFET 301 are charged with an amount of electric charge by the power generation by the vibration-driven energy harvesting element 10 when an abnormal vibration occurs (=current×duration of the vibration), and when the gate voltage becomes greater than or equal to the gate threshold voltage Vth1, the N-channel MOSFET 301 is turned on, and the supply of electric power from the battery 60 to the notification unit 70 is started. Therefore, the smaller the capacitance of the capacitor 203 is, the higher a sensitivity of detection of an anomaly becomes. In contrast, if the capacitance of the capacitor 203 is made excessively small, a slight power generation due to a normal vibration can cause an on operation (a malfunction). Therefore, circuit parameters including current ratings of elements and the capacitance of the capacitor 203 are set with consideration given to the sensitivity of detection of an anomaly, false detection, and the like.

For example, when an abnormal vibration stops, and vibration of the vibration-driven energy harvesting element 10 stops, the discharge via the resistor 204 resets the charge voltage V1 to a voltage sufficiently lower than the gate threshold voltage Vth1. A time constant of the resetting is given by (the capacitance of the capacitor 203)×(the resistance value of the resistor 204). If this value is smaller than a rating duration of an abnormal vibration, the capacitor is discharged rather while the capacitor is not sufficiently charged, which disables the N-channel MOSFET 301 from being turned on. On the contrary, if this time constant is excessively large, the N-channel MOSFET 301 may be erroneously turned on by continuation of a minute charging current by a normal vibration. In addition, it is necessary to maintain the on state of the N-channel MOSFET 301 by the voltage divided by the resistor 402 and the resistor 204. However, if a combined resistance value of the resistor 204 and the resistor 402 is excessively small, electric power from the power supply consumed for holding the N-channel MOSFET 301 in the on state increases. As seen from the above, the resistance value of the resistor 204 and the capacitance of the capacitor 203 are appropriately designed from the viewpoints of maintaining the on state and reducing the consumption of the electric power from the power supply.

Here, setting of the time constant for preventing the malfunction will be discussed concerning the erroneous turning on of the N-channel MOSFET 301 by a minute charging current continued by a normal vibration.

In the present embodiment, attention is paid to a vibration having "a certain frequency and an acceleration with a certain value or more" that appears when an anomaly occurs, and a resonance frequency of the vibration-driven energy harvesting element 10 is made to match the "certain frequency" to determine an anomaly. The determination is not performed based on an instantaneous value of the amount of the power generation using a threshold value but is performed with consideration given to the duration, so that the malfunction is eliminated. Specifically, the determination is performed based on continuation of a vibration with the acceleration having the certain value or more for a certain time period.

Here, with reference to FIG. 1, the setting of the time constant using a capacitance C of the capacitor 203 of the rectification/electricity storage unit 20 and a resistance value R of the resistor 204 for performing the determination will be described.

The vibration-driven energy harvesting element 10 and a rectification unit (a part constituted by the diodes 201 and 202 of the rectification/electricity storage unit 20) are regarded as a direct current source (current i10, duration t2). The N-channel MOSFET 301 is assumed to enter the on state when the charge voltage V1 of the capacitor 203 exceeds the gate threshold voltage Vth1 of the N-channel MOSFET 301.

The current i10 of the vibration-driven energy harvesting element 10 is in direct proportion to an acceleration of a vibration. Therefore, when the current i10 and the gate threshold voltage Vth1 of the N-channel MOSFET 301 are determined, a lower limit value of the resistance value R of the resistor 204 can be calculated by Expression (1) shown below.

[Expression 1]

$$Vth1 < i_{10} \cdot R \tag{1}$$

It suffices that the resistance value R is set to be a large value so that i10·R is reliably higher than the gate threshold voltage Vth1.

During the duration of the power generation by the vibration-driven energy harvesting element 10, the charge voltage V1 of the capacitor 203 can be given by Expression (2) shown below using the capacitance C of the capacitor 203 and an elapsed time t1 (<t2) from a start of the power generation.

[Expression 2]

$$V1 = i_{10} \cdot R\left[1 - \exp\left(-\frac{t1}{RC}\right)\right] \tag{2}$$

Therefore, a size of the capacitance C of the capacitor 203 to bring the N-channel MOSFET 301 into the on state at the elapsed time t1 (<t2) from the start of the power generation can be calculated by Expression (3) shown below with Vth1 substituted for V1 in Expression (2) shown above.

[Expression 3]

$$C = \frac{-t1}{R\ln\left(1 - \frac{Vth_1}{i10 \cdot R}\right)} \tag{3}$$

By setting the time constant with the capacitance C of the capacitor 203 of the rectification/electricity storage unit 20 and the resistance value R of the resistor 204 in this manner, a voltage value of the rectification/electricity storage unit 20 that is charged by the power generation by a vibration that has a certain frequency and an acceleration with a certain value or more and continues for a certain time period can be determined using a threshold value.

The vibration-driven energy harvesting element 10 described above is a vibration-driven energy harvesting element of a resonance type of which a vibration amplitude increases at a natural frequency f0. At or in the vicinity of the natural frequency f0, the vibration-driven energy harvesting element 10 provides a large voltage of the power generation. Accordingly, by designing the vibration-driven energy harvesting element 10 in such a manner that the natural frequency f0 is made to substantially match a frequency (or a frequency range) that is generated when an anomaly occurs in a device being a monitoring target, the voltage of the power generation increases only when an anomaly occurs, thus bringing the switch circuit 30 into an on state to supply the electric power to the notification unit 70, by which the anomaly is notified. In a normal time in which the notification unit 70 does not notify an anomaly, the voltage of the power generation by the vibration-driven energy harvesting element 10 is low, and the switch circuit 30 is maintained in an off state. Therefore, useless consumption of the battery 60 is prevented. In the case where frequencies generated from a monitoring target are distributed over a predetermined frequency band, the natural frequency f0 is set in accordance with the frequency band.

As seen from the above, while the vibration-driven energy harvesting element 10 in the present embodiment functions as a sensor for catching an anomaly, the vibration-driven energy harvesting element 10 needs no external power supply, unlike a usual acceleration sensor or the like. In the case where an acceleration sensor or the like that needs a power supply is used as a sensor for anomaly detection in place of the vibration-driven energy harvesting element 10, the sensor for anomaly detection always consumes electric power irrespective of whether a monitoring target is in an abnormal state. Therefore, a lifetime of the battery 60 is shortened accordingly, which requires the battery to be replaced more frequently. In contrast, the monitoring device 1 illustrated in FIG. 1 consumes electric power only in the notification action when an anomaly occurs. Therefore, prolongation of the lifetime of the battery 60 is allowed.

In the monitoring device 1 illustrated in FIG. 1, the natural frequency f0 of the vibration-driven energy harvesting element 10 is made to match the frequency generated when an anomaly occurs in its monitoring target. Thus, the switch circuit 30 is off when the monitoring target is normal, and the switch circuit 30 is turned on when an anomaly occurs. In contrast, in the case where a frequency f of a sound or a vibration occurred when the monitoring target is in a normal state changes when the monitoring target is in an abnormal state, an anomaly in the monitoring target can be detected by configuring the monitoring device 1 to detect such a change in the frequency.

In the configuration to detect the change in the frequency, the natural frequency f0 of the vibration-driven energy harvesting element 10 is made to match the normal frequency f. When the monitoring target is normal, a high charge voltage V1 is provided. When the monitoring target is in an abnormal state, and the generated frequency deviates from the normal frequency f, the charge voltage V1 becomes V1≈, 0. In this case, the switch circuit 30 is configured to operate in an opposite manner to the switch circuit 30 illustrated in FIG. 1. That is, the switch circuit 30 turns off the supply of electric power from the battery 60 to the notification unit 70 when the charge voltage V1 becomes greater than or equal to a predetermined threshold value, and turns on the supply of electric power when the charge voltage V1 becomes less than the predetermined threshold value. For example, the vibration-driven energy harvesting element 10 is connected to an input side of a normally-closed photorelay (b contact). The supply of electric power is turned off in power generation, and the supply of electric power is turned on when the power generation is stopped. With the supply of electric power, the notification unit 70 transmits a signal to notify the anomaly to an external device.

The switch circuit 30 illustrated in FIG. 1 can be also configured such that the natural frequency of the vibration-driven energy harvesting element 10 is set to the normal frequency, so that when the monitoring target is normal, the charge voltage V1 becomes greater than or equal to the threshold value to bring the switch circuit 30 into the on state, and the notification unit 70 sends a normality signal to notify the normal state. In the case of this configuration, an anomaly in the monitoring target can be informed of when the charge voltage V1 becomes less than the threshold value to bring the switch circuit 30 into the off state, thus interrupting the normality signal. The configuration provides energy savings that are less effective than those provided by the configuration illustrated in FIG. 1 but can reduce power consumption as compared with a sensor equipped with an acceleration sensor element and an FFT.

Alternatively, while the natural frequency f0 of the vibration-driven energy harvesting element 10 is made to match the frequency generated when an anomaly occurs in the monitoring target as in the case illustrated in FIG. 1, the switch circuit 30 may be configured to operate in an opposite manner to the switch circuit 30 illustrated in FIG. 1. In this case, the supply of electric power is turned off when the charge voltage V1 becomes greater than or equal to the predetermined threshold value, and the supply of electric power is turned on when the charge voltage V1 becomes less than the predetermined threshold value. The notification unit 70 transmits a signal that indicates normality. This configuration also provides energy savings that are less effective than those provided by the configuration illustrated in FIG. 1 but can reduce power consumption as compared with a sensor equipped with an acceleration sensor element and an FFT.

Modification 1

In the example illustrated in FIG. 1, the notification unit 70 notifies an anomaly by causing the transmission unit 701 to transmit a notification signal to notify whether the anomaly occurs. However, means for the notification is not only the transmission of a notification signal. There are various possible means for the notification. For example, as in Modification 1 illustrated in FIG. 2, an LED display unit 703 that emits light on detection of an anomaly may be provided in place of the transmission unit 701. When an anomaly is detected by a vibration-driven energy harvesting element 10, and electric power is supplied from a battery 60 to a notification unit 70, a control unit 702 switches a switch 704 in an off state (an opened state) to an on state (a closed state). The switch 704 is configured such that the switch 704 having entered the on state maintains the on state even when the supply of electric power to the notification unit 70 via a switch circuit 30 enters a stopped state. As a result, once the LED display unit 703 lights up upon detection of an anomaly, the lighting state is maintained, even when an amount of power generation by the vibration-driven energy harvesting element 10 decreases, making the charge voltage V1 less than a threshold value to bring the switch circuit 30 into an off state.

Modification 2

Figure 3:
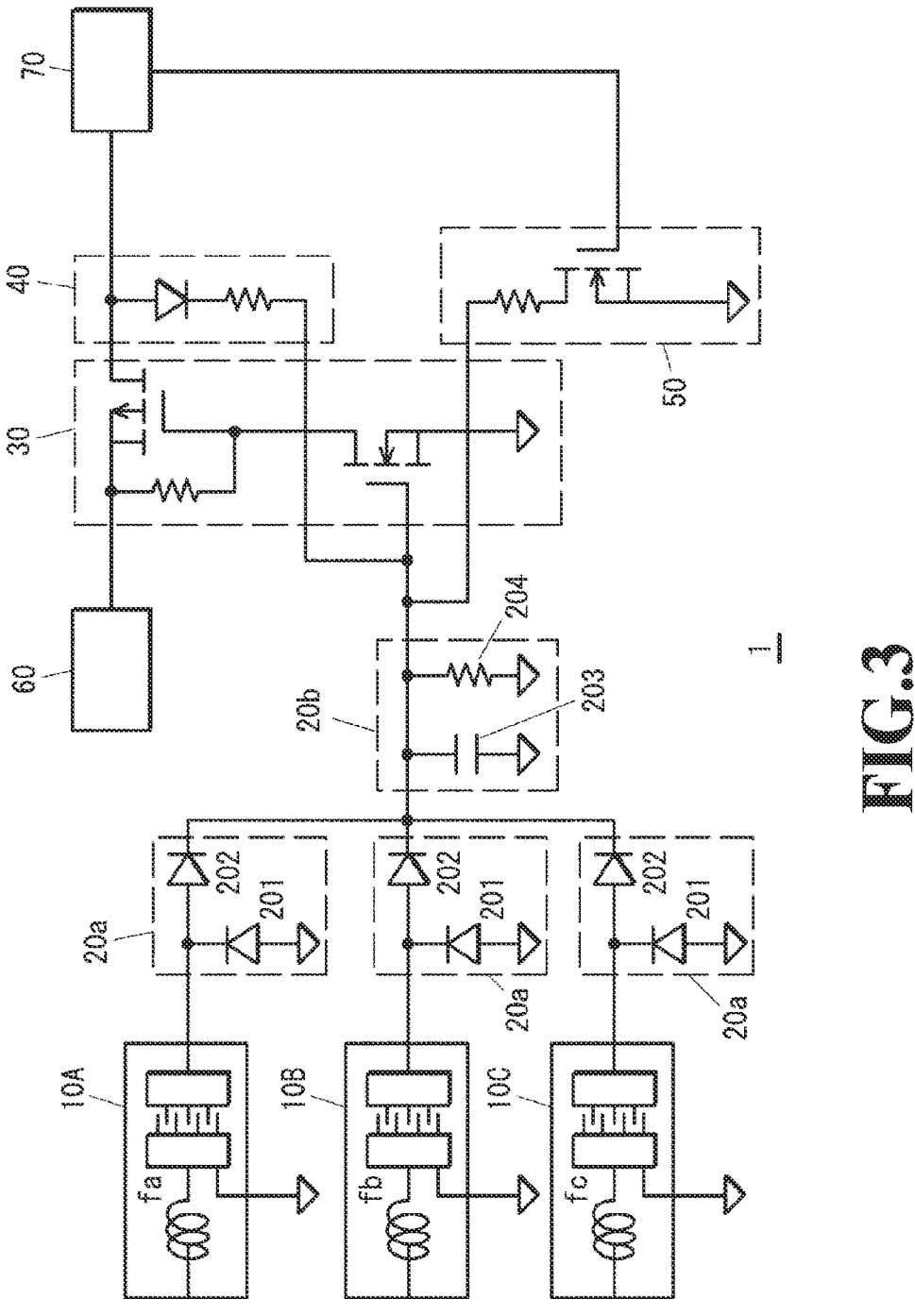
FIG. 3 is a diagram illustrating Modification 2.

FIG. 3 is a diagram illustrating Modification 2 of the embodiment described above. A monitoring device 1 illustrated in FIG. 3 is provided with configurations constituted by vibration-driven energy harvesting elements 10A, 10B, and 10C and their rectification units 20a, and the configurations are connected in parallel to an electricity storage unit 20b. Natural frequencies of the vibration-driven energy harvesting elements 10A, 10B, and 10C are fa, fb, and fc, respectively. For example, in the case where there are three types of monitoring targets, and their frequencies are f1, f2, and f3, the natural frequencies are set such that fa=f1, fb=f2, and fc=f3. When any one of the frequencies f1, f2, and f3 is occurred from the respective monitoring targets, corresponding one of the vibration-driven energy harvesting elements 10A, 10B, and 10C generates electric power, and when a charge voltage V1 becomes greater than or equal to a threshold value, a switch circuit 30 enters an on state, and the notification unit 70 performs notification.

Figure 4:
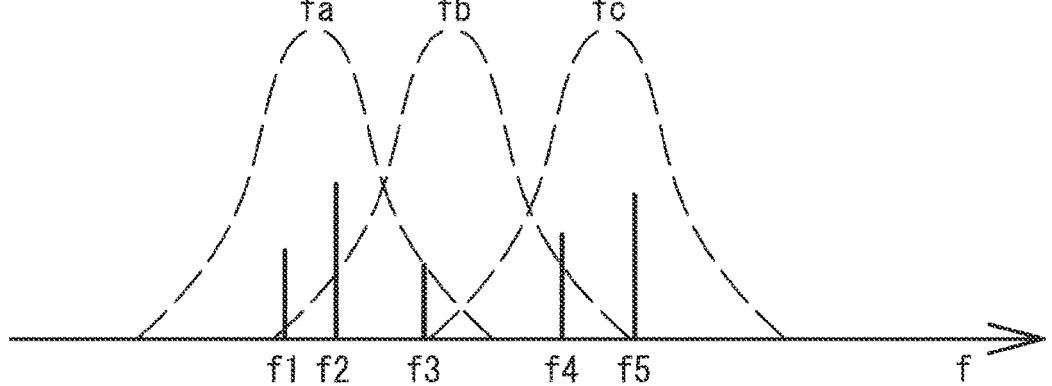
FIG. 4 is a diagram illustrating a relation between frequencies f1 to f5 of abnormal sounds and natural frequencies fa to fc of vibration-driven energy harvesting elements.

In the example illustrated in FIG. 3, the three vibration-driven energy harvesting elements 10A, 10B, and 10C are provided. However, the number of the vibration-driven energy harvesting elements may be two or may be four or more. By providing a plurality of vibration-driven energy harvesting elements having different natural frequencies, a plurality of types of anomalies can be detected. There is a case where even one type of an anomaly can occur abnormal sounds with frequencies f1 to f5 that are scattered over a wide frequency band as illustrated in FIG. 4. In such a case, when any one of the abnormal sounds with the frequencies f1 to f5 is occurred, the occurrence of the abnormal sound can be detected by setting the natural frequencies fa to fc of the vibration-driven energy harvesting elements 10A to 10C as illustrated in FIG. 4.

In the case where an abnormal sound has only one type of frequency, f1, a plurality of vibration-driven energy harvesting elements 10A, 10B, and 10C with their natural frequencies set to be fa=fb=fc=f1 may be provided. In such a configuration, even when an operational trouble occurs in any one of the vibration-driven energy harvesting elements, occurrence of the abnormal sound can be detected by power generation by another normal vibration-driven energy harvesting element.

Modification 3

Figure 5:
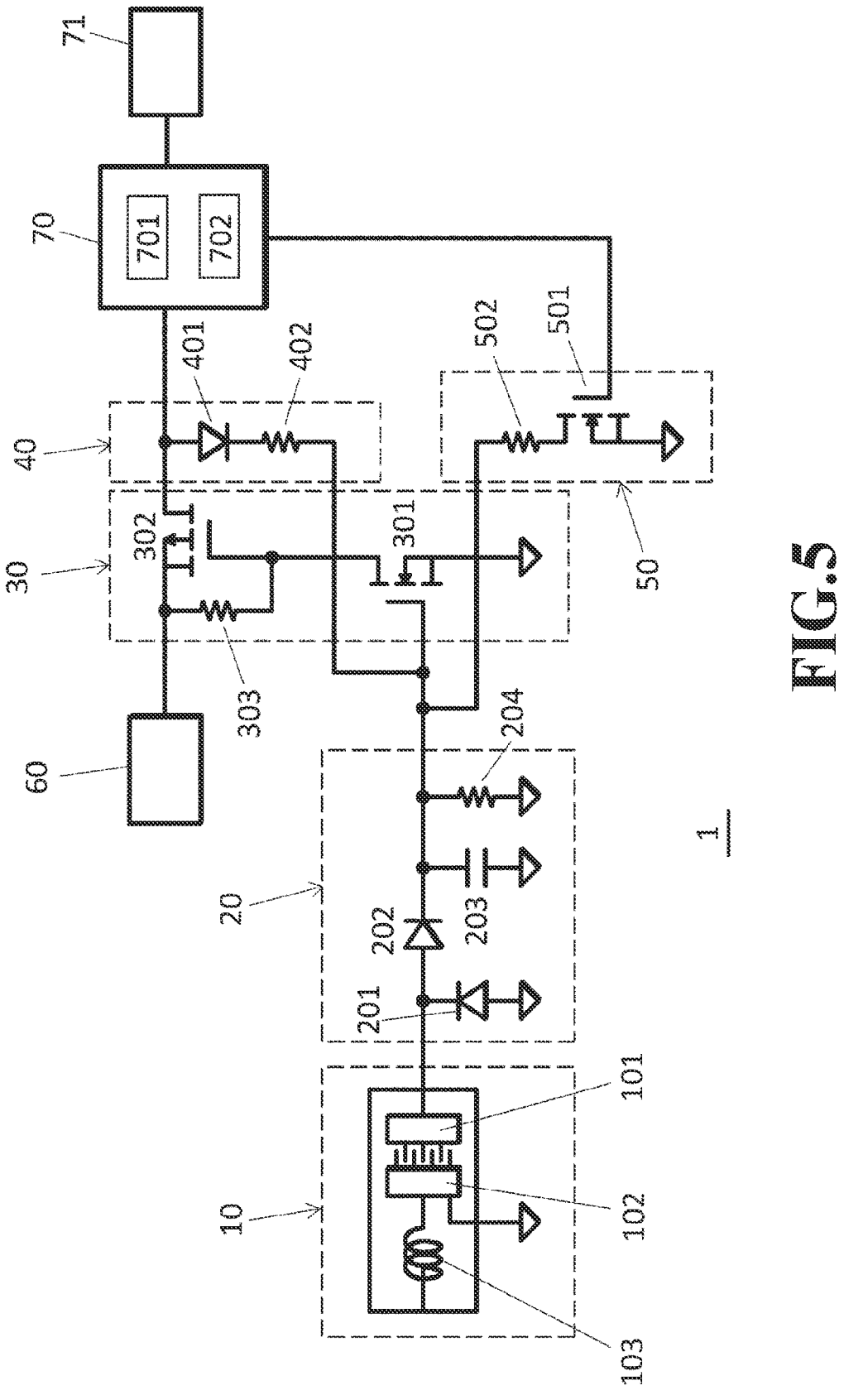
FIG. 5 is a diagram illustrating Modification 3.

FIG. 5 is a diagram illustrating Modification 3 of the embodiment described above. FIG. 5 illustrates a notification destination device 71 in addition to a monitoring device 1 having the same configuration as illustrated in FIG. 1. The notification destination device 71 is a transmission destination of a signal from a notification unit 70. In the embodiment described above, the monitoring device 1 transmits a signal indicating whether its monitoring target is normal or abnormal by detecting a sound or a vibration that indicates a normal state or an abnormal state of the monitoring target. However, the monitoring device 1 may be configured such that, when a state of its monitoring target changes from a silent state to a state in which the monitoring target occurs a predetermined sound (e.g., a periodic tone rather than a sound indicating an anomaly in the monitoring target), the monitoring device 1 detects the predetermined sound and causes the notification unit 70 to transmit a signal indicating a state change to the notification destination device 71. That is, the resonance frequency of the vibration-driven energy harvesting element 10 may be made to match a "certain frequency" of the predetermined sound, and whether the predetermined sound is occurred may be determined with consideration given to a duration of the predetermined sound. Operation of the monitoring device 1 is the same as in the embodiment described above.

In Modification 3, for example, when the predetermined sound is emitted from the monitoring target, the notification unit 70 can transmit a Wake-up signal to wake up the notification destination device 71. This can significantly reduce (or eliminate) standby power consumption to extend a lifetime of a battery. That is, the notification destination device 71 can be waked up by the vibration-driven energy harvesting element 10 and switching elements 301 and 302 when a sound with a specific frequency is occurred by a monitoring target. Alternatively, the monitoring device 1 may be configured such that, when the predetermined sound is emitted from the monitoring target, the notification unit 70 transmits a Sleep signal to the notification destination device 71. As seen from the above, according to the present modification, the monitoring device 1 can notify a state change of the monitoring target and can control operation of a target system (i.e., the notification destination device 71).

Application Examples

Figure 6:
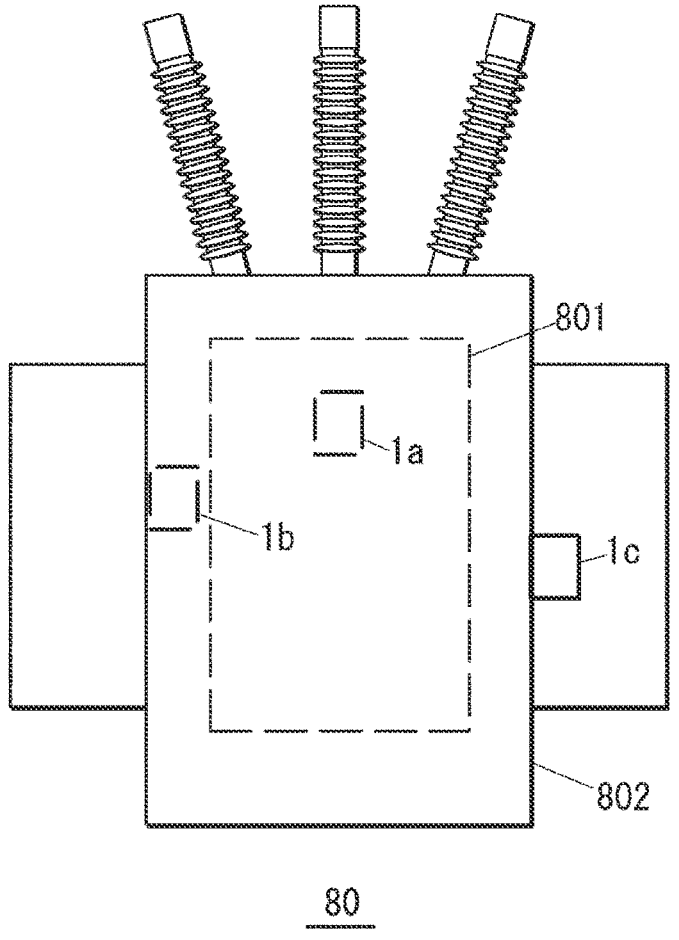
FIG. 6 is a diagram illustrating an application example of the monitoring device.

The case where the monitoring device 1 described above is applied to a device that monitors a state of a transformer in a transformer substation will be described. FIG. 6 is a diagram schematically illustrating appearance of a transformer 80 in the transformer substation. A transformer body 801 is housed inside a housing 802. The monitoring device 1 is a monitoring device 1 of which the components illustrated in FIG. 1 are housed in a case. For example, the monitoring device 1 is attached to a surface of the transformer body 801 as a monitoring device 1a or attached to an inner wall surface or an outer wall surface of the housing 802 as a monitoring device 1b or 1c. As a method of attaching the monitoring device 1, various methods such as bonding and screwing are possible.

In the transformer 80, magnetostriction occurs when a magnetic flux interacts with an iron core, occurring an energization sound having a frequency that is usually proportional to an integral multiple of twice a power supply frequency. When an internal anomaly (abnormal voltage due to penetration of lightning, etc., decrease in dielectric strength due to degradation of insulating paper, layer short, etc.) occurs in the transformer 80, insulation of a wound wire cannot be kept, and a discharge occurs. In general, the discharge takes forms of intermittent partial discharge, continuous discharge, and arc discharge in this order as a degree of the anomaly increases. The natural frequency f0 of the vibration-driven energy harvesting element 10 of the monitoring device 1 is set to be substantially the same as a frequency of a sound or a vibration that is occurred by an anomaly in the transformer body 801.

In a transformer substation, an inspection of a transformer is usually performed in the form of patrolling inspection by visual check in which five senses such as visual sensation are mainly used to check for an anomaly. When the inspection is performed in a patrol by identifying an abnormal sound with human ears, a discharge and an arc discharge can be identified because the discharge and the arc discharge are likely to occur an abnormal sound all the time. However, the partial discharge is a low energy discharge and occurs an abnormal sound with a low sound pressure level. Therefore, there is a possibility that the abnormal sound is buried in energization sounds and thus inaudible. Further, regular inspection by patrolling involves a problem in that handling of an anomaly may be delayed in the case where the anomaly occurs in a period during which the inspection is not performed.

In contrast, by providing the monitoring devices 1 (1a to 1c) on the transformer 80 as illustrated in FIG. 6, whether any anomaly occurs in the transformer 80 can be monitored continuously, and an anomaly can be speedily handled. For example, in the case of a monitoring device 1 provided with one vibration-driven energy harvesting element 10 as illustrated in FIG. 1, by making the natural frequency f0 of the vibration-driven energy harvesting element 10 match a frequency of a partial discharge, which occurs an abnormal sound of an earliest phase, an anomaly can be detected before an abnormal state proceeds to a phase of an arc discharge. When a partial discharge occurs intermittently, a sound pressure level and a vibration level of the partial discharge are both low. However, by making the natural frequency f0 match the frequency of the partial discharge, the vibration-driven energy harvesting element 10 sensitively reacts to the partial discharge, and thus the anomaly in the transformer 80 can be detected reliably.

Alternatively, the monitoring device 1 illustrated in FIG. 3, which includes vibration-driven energy harvesting elements 10A to 10C, may be used. In this case, the natural frequencies fa to fc may be set to be the same values or may be set to be different values. In the case where the natural frequencies fa to fc are set to be the same values, the frequencies are set to match the frequency of the partial discharge, for example. Including the multiple vibration-driven energy harvesting elements 10A to 10C allows an improvement in reliability in the case of a trouble in a vibration-driven energy harvesting element.

In the case where the natural frequencies fa to fc are set to be different values so that a plurality of abnormal sounds can be separately detected, for example, the natural frequency fa is made to match the frequency of the partial discharge, the natural frequency fb is made to match a frequency of the continuous discharge in the next phase, and the natural frequency fc is made to match a frequency of the arc discharge in the final phase. When the case where the monitoring device 1 illustrated in FIG. 3 is used is compared with the case where the above-described configuration illustrated in FIG. 1 is applied, the case of the configuration illustrated in FIG. 1 cannot detect an anomaly in a situation where the continuous discharge in the next phase occurs although an abnormal sound of the partial discharge is not occurred. However, in the case where the monitoring device 1 having the configuration illustrated in FIG. 3 is adopted, even in such a situation, the continuous discharge in the next phase can be detected by power generation of the vibration-driven energy harvesting element 10B.

Figure 2:
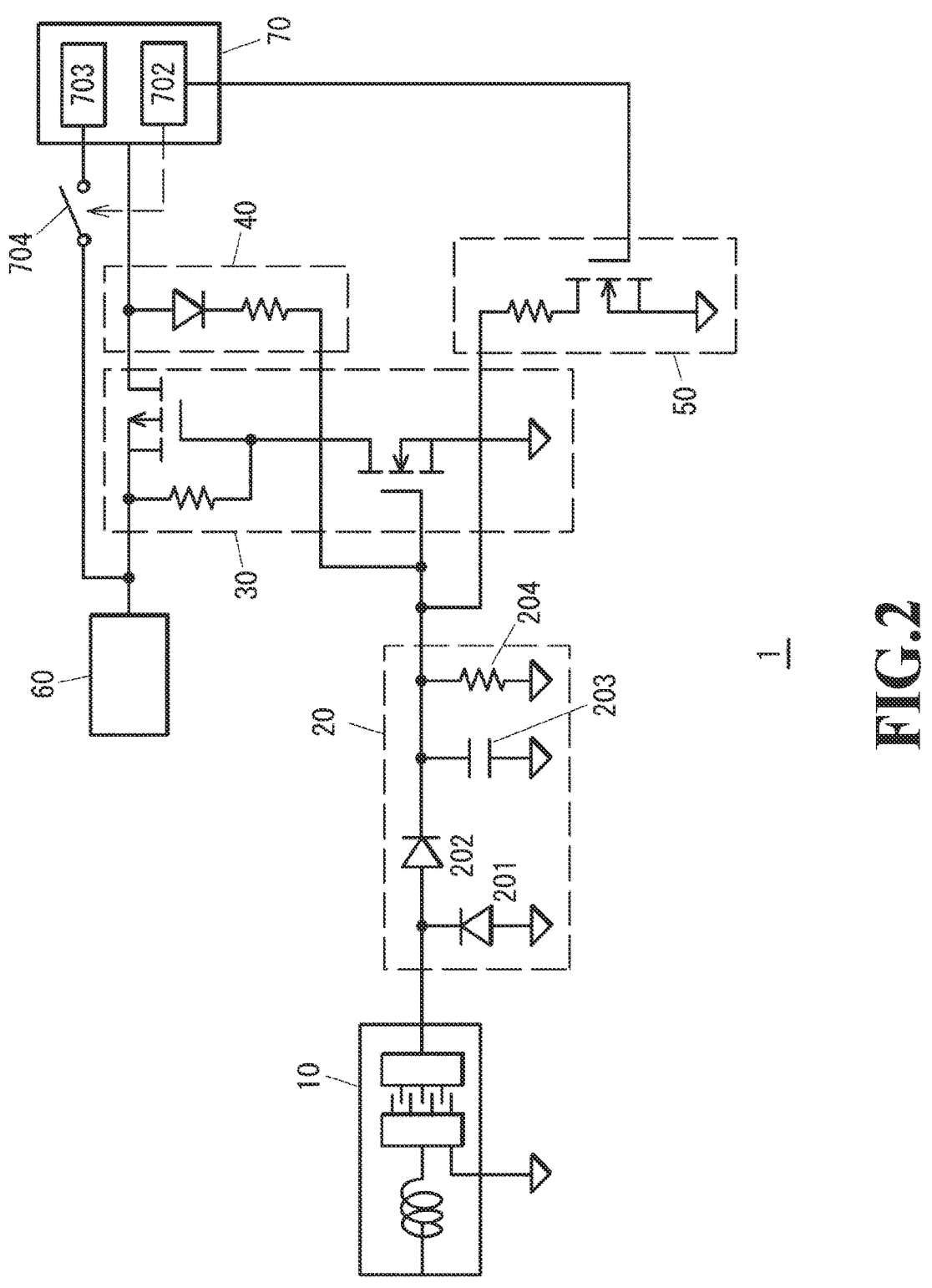
FIG. 2 is a diagram illustrating Modification 1.

In a conventional monitoring method in which an operator patrols to find an abnormal sound from a transformer, an abnormal sound occurred intermittently may be missed. However, in the case where the monitoring device 1 illustrated in FIG. 2 is applied, light emission by the LED display is unlikely to be missed in patrolling, allowing improvement in reliability in monitoring an anomaly. In this case, the supply of electric power from the battery 60 to the LED display unit 703 is continued even when the abnormal sound goes out and the switch circuit 30 enters the off state from the on state. However, replacing the battery 60 when an anomaly is found in a periodic patrol enables avoidance of such an inconvenience that the LED display unit 703 does not light because of exhaustion of the battery next time an anomaly occurs.

The description of the application examples is given of the examples of the application to a transformer in a transformer substation. However, the application of the monitoring device 1 in the present embodiment is not limited to an application to a transformer. The monitoring device 1 is also applicable to monitoring a state of a motor, a pump, or the like. For example, an anomaly is detected by detecting a change in sound of a motor of an air conditioner, that is, a change in frequency, with the monitoring device 1.

Actions and effects of the embodiment described above are summarized as follows.

(1) As illustrated in FIG. 1, the monitoring device 1 includes the vibration-driven energy harvesting element 10 as a vibration-driven energy harvesting unit that performs power generation in response to a sound or a vibration being occurred by a monitoring target and having a predetermined frequency, and the notification unit 70 that notifies an anomaly in the monitoring target based on whether the vibration-driven energy harvesting element 10 generates the electric power. The notification unit 70 is configured to notify an anomaly based on a magnitude relationship between a predetermined threshold value and a voltage value of the power generation by the vibration-driven energy harvesting element 10, in the case where, for example, the voltage value of the vibration-driven energy harvesting element 10 is greater than or equal to the predetermined threshold value. Therefore, the vibration-driven energy harvesting element 10, which functions as a sensor unit, requires no power supply. In a conventional monitoring method in which an operator patrols to find an abnormal sound, the operator may miss the abnormal sound. However, missing an anomaly can be prevented with a configuration in which the vibration-driven energy harvesting element 10 detects an abnormal sound or an abnormal vibration with the power generation and the notification unit 70 notifies the anomaly.

(2) The notification unit 70 is preferably activated in response to a switch in the magnitude relationship between the predetermined threshold value and the voltage value of the power generation by the vibration-driven energy harvesting element 10 and notifies an anomaly in the monitoring target. For example, in the configuration illustrated in FIG. 1, when the voltage value of the power generation by the vibration-driven energy harvesting element 10 is switched from a state where the voltage value is less than the predetermined threshold value to a state where the voltage value is greater than or equal to the predetermined threshold value, the supply of electric power from the battery 60 to the notification unit 70 enters the on state, activating the notification unit 70, and the notification unit 70 transmit a notification signal. Therefore, no standby power consumption is needed until the vibration-driven energy harvesting element 10 reacts to a sound or a vibration having the predetermined frequency. A power consumption of the battery 60 thus can be reduced.

(3) As illustrated in FIG. 1, the monitoring device 1 further includes the battery 60 for operating the notification unit 70 and the switch circuit 30 as a switch unit that permits the supply of electric power from the battery 60 to the notification unit 70 when the voltage value of the power generation by the vibration-driven energy harvesting element 10 is greater than or equal to the predetermined threshold value, that is, when the charge voltage V1 is greater than or equal to the predetermined threshold value (gate threshold voltage Vth1), and that shuts off the supply of electric power from the battery 60 to the notification unit 70 when the voltage value of the power generation by the vibration-driven energy harvesting element 10 is less than the predetermined threshold value. When the supply of electric power is performed on the permission from the switch circuit 30, the notification unit 70 is activated and notifies an anomaly in the monitoring target.

In the configuration illustrated in FIG. 1, the notification unit 70 is activated by switching the supply of electric power from the off state to the on state by the switch circuit 30. However, the monitoring device 1 may be configured such that the notification unit 70 is connected to the battery 60, and that a start of the power generation by the vibration-driven energy harvesting element 10 serves as a trigger signal to activate the notification unit 70.

(4) As illustrated in FIG. 1, the monitoring device 1 further includes the self-holding circuit 40 and the turn-off circuit 50 as a holding unit that holds, for a predetermined time period, a state of permitting the supply of electric power by the switch circuit 30 and then switches the switch circuit 30 to a shutting state when the voltage value of the power generation by the vibration-driven energy harvesting element 10 being greater than or equal to the predetermined threshold value becomes a value less than the predetermined threshold value. With such a configuration that the state of permitting the supply of electric power is held for the predetermined time period, the notification process by the notification unit 70 can be completed reliably by setting the predetermined time period to greater than or equal to a time period taken by the notification process. In addition, since the switch circuit 30 is switched to the shutting state after the holding for the predetermined time period, useless power consumption by the notification unit 70 can be prevented.

(5) As illustrated in FIG. 3, the monitoring device 1 includes the plurality of vibration-driven energy harvesting elements 10A to 10C as vibration-driven energy harvesting units, and the switch circuit 30 permits the supply of electric power to the notification unit 70 when at least one of voltage values of the plurality of vibration-driven energy harvesting elements 10A to 10C is greater than or equal to the predetermined threshold value, and the switch circuit 30 shuts off the supply of electric power to the notification unit 70 when all of the voltage values of the plurality of vibration-driven energy harvesting elements 10A to 10C are less than the predetermined threshold value. That is, the notification unit 70 performs the notification when at least one of the voltage values of the plurality of vibration-driven energy harvesting elements 10A to 10C is greater than or equal to the predetermined threshold value.

(6) For example, by setting the natural frequencies of the plurality of vibration-driven energy harvesting elements 10A to 10C to be different from one another, a plurality of abnormal sounds or abnormal vibrations having different frequencies can be detected.

(7) As illustrated in FIG. 6, in the case where the monitoring target of the monitoring device 1 is the transformer 80 in the transformer substation, the natural frequency of the vibration-driven energy harvesting element 10 is set to the frequency of the partial discharge of the transformer 80. The partial discharge is a discharge in an early phase of a discharge that occurs as an anomaly in the transformer 80. By detecting the partial discharge with the monitoring device 1, an anomaly can be detected before the transformer 80 breaks down.

(8) The monitoring device 1 further includes the battery 60 for operating the notification unit 70 and a switch unit that permits the supply of electric power from the battery 60 to the notification unit 70 when the voltage value of the power generation by the vibration-driven energy harvesting element 10 is greater than or equal to the predetermined threshold value, and that shuts off the supply of electric power from the battery 60 to the notification unit 70 when the voltage value of the power generation by the vibration-driven energy harvesting element 10 is less than the predetermined threshold value. The notification unit 70 is activated by the supply of electric power to notify normality in the monitoring target and stops notifying the normality by shutting off the supply of electric power to notify the anomaly in the monitoring target.

(9) The monitoring device 1 further includes the battery 60 for operating the notification unit 70 and a switch unit that shuts off the supply of electric power from the battery 60 to the notification unit 70 when the voltage value of the power generation by the vibration-driven energy harvesting element 10 is greater than or equal to the predetermined threshold value, and that permits the supply of electric power from the battery 60 to the notification unit 70 when the voltage value of the power generation by the vibration-driven energy harvesting element 10 is less than the predetermined threshold value. When the supply of electric power is performed on the permission from the switch unit, the notification unit 70 is activated and notifies an anomaly in the monitoring target.

(10) The monitoring device 1 further includes the battery 60 for operating the notification unit 70 and a switch unit that shuts off the supply of electric power from the battery 60 to the notification unit 70 when the voltage value of the power generation by the vibration-driven energy harvesting element 10 is greater than or equal to the predetermined threshold value, and that permits the supply of electric power from the battery 60 to the notification unit 70 when the voltage value of the power generation by the vibration-driven energy harvesting element 10 is less than the predetermined threshold value. The notification unit 70 is activated by the supply of electric power to notify normality in the monitoring target and stops notifying the normality by shutting off the supply of electric power to notify the anomaly in the monitoring target.

(11) Further, transmission of a wireless signal to notify the anomaly to an external device as with the transmission unit 701 illustrated in FIG. 1 allows automation in a monitoring operation.

(12) As illustrated in FIG. 1, the monitoring device 1 further includes the rectification/electricity storage unit 20 as an electricity storage unit that is charged by the power generation by the vibration-driven energy harvesting element 10. The rectification/electricity storage unit 20 is set such that the rectification/electricity storage unit 20 is caused to have a voltage value greater than or equal to the predetermined threshold value by electric power generated by a vibration that has an acceleration with a certain value or more and continues for a certain time period. With this setting, the switch circuit 30 can be prevented from being caused to malfunction as the switch unit by, for example, continuation of a minute charging current by a normal vibration causes such a charge that the rectification/ electricity storage unit 20 has a voltage value greater than or equal to the predetermined threshold value.

(13) Further, when the monitoring target changes to a state of occurring the predetermined sound, the monitoring device 1 may notify the state change to control an external device. In this case, the state of the monitoring target is not necessarily abnormal.

Various embodiments and modifications have been described above, but the present invention is not limited to these details. Other aspects contemplated within the scope of the technical concept of the present invention are also included within the scope of the present invention.

REFERENCE SIGNS LIST

1, 1a to 1c . . . monitoring device, 10, 10A to 10C . . . vibration-driven energy harvesting element, 20 . . . rectification/electricity storage unit, 20a . . . rectification unit, 20b . . . electricity storage unit, 30 . . . switch circuit, 40 . . . self-holding circuit, 50 . . . turn-off circuit, 60 . . . battery, 70 . . . notification unit, 80 . . . transformer, 701 . . . transmission unit, 703 . . . LED display unit, 704 . . . switch

The invention claimed is:

1. A monitoring device comprising:
a vibration-driven energy harvesting unit that performs power generation in response to a sound or a vibration being occurred by a monitoring target and having a predetermined frequency;
a notification unit that notifies a state change of the monitoring target based on a magnitude relationship between a predetermined threshold value and a voltage value of the power generation by the vibration-driven energy harvesting unit; and
a switch unit configured to activate the notification unit when the voltage value is greater than or equal to the predetermined threshold value, and to deactivate the notification unit when the voltage value is less than the predetermined threshold value,
wherein the vibration-driven energy harvesting unit functions as both a vibration sensor and a power source without requiring an external power supply.

2. The monitoring device according to claim 1, wherein the notification unit is activated in response to a switch in the magnitude relationship between the predetermined threshold value and the voltage value of the power generation and notifies the state change of the monitoring target.

3. The monitoring device according to claim 1, further comprising:
a power supply for operating the notification unit; and
wherein the switch unit is configured to permit supply of electric power from the power supply to the notification unit when the voltage value of the power generation is greater than or equal to the predetermined threshold value and that shuts off the supply of electric power from the power supply to the notification unit when the voltage value of the power generation is less than the predetermined threshold value, wherein
when the supply of electric power is performed on permission from the switch unit, the notification unit is activated and notifies the state change of the monitoring target.

4. The monitoring device according to claim 3, further comprising a holding unit that holds, for a predetermined time period, a state of permitting the supply of electric power by the switch unit and then switches the switch unit to a shutting state when the voltage value of the power generation being greater than or equal to the predetermined threshold value becomes a value less than the predetermined threshold value.

5. The monitoring device according to claim 3, comprising
a plurality of the vibration-driven energy harvesting units, wherein
the switch unit permits the supply of electric power when at least one of voltage values of the plurality of the vibration-driven energy harvesting units is greater than or equal to the predetermined threshold value, and shuts off the supply of electric power when all of the voltage values of the plurality of the vibration-driven energy harvesting units are less than the predetermined threshold value.

6. The monitoring device according to claim 5, wherein each of the plurality of the vibration-driven energy harvesting units has a different natural frequency from one another.

7. The monitoring device according to any one of claim 3, wherein
the monitoring target is a transformer, and
a natural frequency of the vibration-driven energy harvesting unit is set to a frequency of a partial discharge of the transformer.

8. The monitoring device according to claim 1, further comprising:
a power supply for operating the notification unit; and
wherein the switch unit is configured to permit supply of electric power from the power supply to the notification unit when the voltage value of the power generation is greater than or equal to the predetermined threshold value and that shuts off the supply of electric power from the power supply to the notification unit when the voltage value of the power generation is less than the predetermined threshold value, wherein
the notification unit is activated by the supply of electric power to notify normality in the monitoring target and stops notifying the normality by shutting off the supply of electric power to notify an anomaly in the monitoring target.

9. The monitoring device according to claim 1, further comprising:
a power supply for operating the notification unit; and
wherein the switch unit is configured to shut off supply of electric power from the power supply to the notification unit when the voltage value of the power generation is greater than or equal to the predetermined threshold value and that permits the supply of electric power from the power supply to the notification unit when the voltage value of the power generation is less than the predetermined threshold value, wherein
when the supply of electric power is performed on permission from the switch unit, the notification unit is activated and notifies the state change of the monitoring target.

10. The monitoring device according to claim 1, further comprising:
a power supply for operating the notification unit; and
wherein the switch unit is configured to shut off supply of electric power from the power supply to the notification unit when the voltage value of the power generation is greater than or equal to the predetermined threshold value and that permits the supply of electric power from the power supply to the notification unit when the voltage value of the power generation is less than the predetermined threshold value, wherein the notification unit is activated by the supply of electric power to notify normality in the monitoring target and stops notifying the normality by shutting off the supply of electric power to notify an anomaly in the monitoring target.

11. The monitoring device according to claim 1, wherein the notification unit transmits a wireless signal to notify the state change to an external device.

12. The monitoring device according to claim 3, further comprising an electricity storage unit that is charged by the power generation by the vibration-driven energy harvesting unit, the electricity storage unit being set to have a voltage value greater than or equal to the predetermined threshold value by electric power generated by a vibration that has an acceleration with a certain value or more and continues for a certain time period.

* * * * *